United States Patent
Kim et al.

(10) Patent No.: US 9,984,885 B2
(45) Date of Patent: May 29, 2018

(54) NON-VOLATILE MEMORY DEVICE AND METHOD FOR FABRICATING THE SAME

(71) Applicant: SK hynix Inc., Gyeonggi-do (KR)

(72) Inventors: Heon-Joon Kim, Gyeonggi-do (KR); Jong-Hyun Choi, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 534 days.

(21) Appl. No.: 14/285,085

(22) Filed: May 22, 2014

(65) Prior Publication Data

US 2015/0155360 A1    Jun. 4, 2015

(30) Foreign Application Priority Data

Nov. 29, 2013 (KR) .................... 10-2013-0147585

(51) Int. Cl.
*H01L 29/792* (2006.01)
*H01L 21/28* (2006.01)
*H01L 29/423* (2006.01)
*H01L 29/66* (2006.01)

(52) U.S. Cl.
CPC .. *H01L 21/28282* (2013.01); *H01L 29/42352* (2013.01); *H01L 29/66833* (2013.01); *H01L 29/792* (2013.01)

(58) Field of Classification Search
CPC ......... H01L 27/11565; H01L 27/11517; H01L 27/11563; H01L 27/11568; H01L 27/11521; H01L 29/42352; H01L 29/66833; H01L 29/7926
See application file for complete search history.

(56) References Cited

U.S. PATENT DOCUMENTS 8,008,713 B2    8/2011  Dobuzinsky et al.
2003/0209767 A1*  11/2003  Takahashi ............. H01L 27/115
                                           257/390

FOREIGN PATENT DOCUMENTS

KR    1020110077540    7/2011

* cited by examiner

*Primary Examiner* — Steven Loke
*Assistant Examiner* — Scott Stowe
(74) *Attorney, Agent, or Firm* — IP & T Group LLP

(57) ABSTRACT

A non-volatile memory device may include a first well of a first conductive type formed over a substrate, a second well of a second conductive type formed over the substrate to contact the first well, a trench formed over the substrate on a border formed by the contact of the first well and the second well, and a memory gate having a memory layer formed over a surface of the trench, and a gate electrode formed to fill the trench over the memory layer.

20 Claims, 11 Drawing Sheets

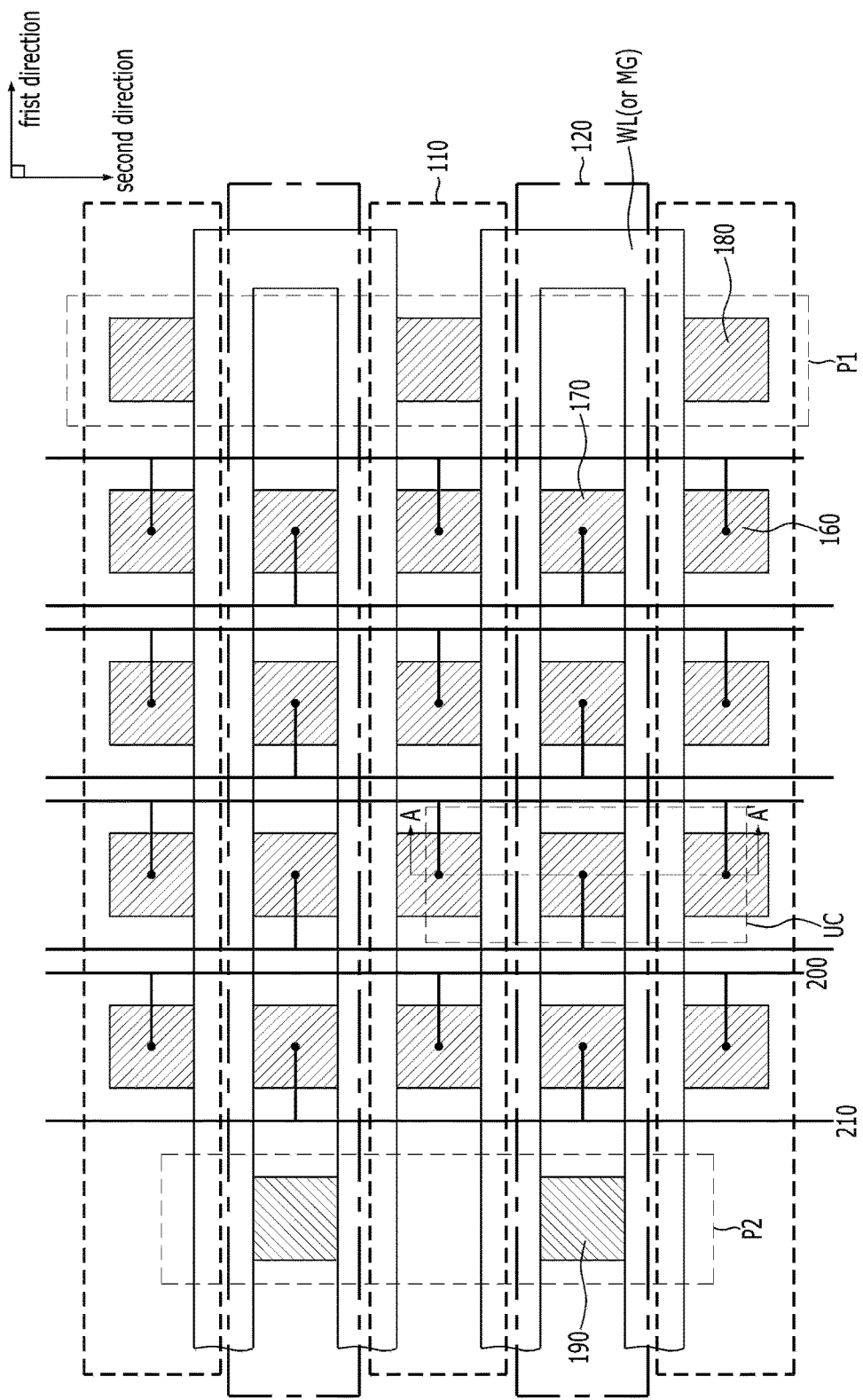

logic region logic region logic region memory region memory region memory region memory region memory region

NON-VOLATILE MEMORY DEVICE AND METHOD FOR FABRICATING THE SAME

CROSS-REFERENCE TO RELATED APPLICATIONS

The present application claims priority of Korean Patent. Application No. 10-2013-0147585, filed on Nov. 29, 2013, which is incorporated herein by reference in its entirety.

BACKGROUND

1. Field

Exemplary embodiments of the present invention relate to a semiconductor device fabrication technology, and more particularly, to a non-volatile memory device and a method for fabricating the same.

2. Description of the Related Art

Recent digital media devices allow people to readily use information they want anywhere at any time. As various analog devices are being converted to digital devices, the digital devices are requiring more and more storage media for storing video, recorded music, and diverse data in an easy way. Meanwhile, the non-memory semiconductor field is also paying attention to System on Chip (SoC) integrated circuits to keep pace with the trend of high integration, and the global semiconductor industry is competitively investing in SoC based technology. The SoC allows a single semiconductor device to include all system technologies. Without system designing technology, it is difficult to develop a non-memory semiconductor device.

As a chips having complex functions with a mixture of both digital and analog circuits emerge as mainstream technology in the SoC field, where complicated technologies are integrated, there is an increasing demand for embedded memory that trims an analog device or stores internal operation algorithms.

Since embedded memories are fabricated based on a logic process or a CMOS process for forming a logic circuit, it is difficult to improve the integration degree and operation characteristics of the embedded memory.

SUMMARY

Exemplary embodiments of the present invention are directed to non-volatile memory devices that have improved integration degree and operation characteristics, and a method for fabricating a non-volatile memory device with those improvements.

In accordance with an embodiment of the present invention, a non-volatile memory device may include a first well of a first conductive type formed over a substrate, a second well of a second conductive type formed over the substrate to contact the first well, a trench formed over the substrate on a border formed by the contact of the first well and the second well, and a memory gate having a memory layer formed over a surface of the trench and a gate electrode formed to fill the trench over the memory layer. Also, the non-volatile memory device may further include a first junction region of a first conductive type formed in the first well, and a second junction region of the first conductive type formed over the second well.

In accordance with another embodiment of the present invention, a non-volatile memory device may include a plurality of first wells of a first conductive type formed over a substrate, a plurality of second wells of a second conductive type formed over the substrate between the first wells to contact the first wells, a plurality of trenches each formed over the substrate on each of a plurality of borders formed by the contacts of the second wells and the first wells, and a plurality of memory gates each having a memory layer formed over a surface of each of the trenches and a gate electrode filling each of the trenches over the memory layer, wherein a pair of the memory gates contacting the second well are provided the same bias during an operation thereby sharing the second well. Also, the non-volatile memory device may further include a plurality of first junction regions of the first conductive type each formed over each of the first wells, and a second junction region of the first conductive type formed over the second wells.

In accordance with another embodiment of the present invention, a non-volatile memory device may include a plurality of first wells of a first conductive type formed over a substrate extended in a first direction, and spaced apart from each other in a second direction crossing the first direction; a plurality of second wells of a second conductive type formed over the substrate, extended in the first direction, and spaced apart from each other in the second direction, wherein adjacent first and second walls contact each other; a plurality of trenches each formed over the substrate on each of a plurality of borders formed by the contacts of the adjacent first and second wells; a plurality of memory gates each having a memory layer formed over a surface of each of the trenches and a gate electrode filling each of the trenches over the memory layer, a plurality of first junction regions of the first conductive type each formed over each of the first wells between the memory gates and spaced apart from each other in the first direction; and a plurality of second junction regions of the first conductive type each formed over each of the second wells between the memory gates and spaced apart from each other in the first direction. Also, the non-volatile memory device may further include a first pick-up region having a first impurity region of the first conductive type formed over one of the first wells, and a second pick-up region having a second impurity region of the second conductive type formed over one of the second wells.

In accordance with an embodiment of the present invention, a method for fabricating a non-volatile memory device may include preparing a substrate having a logic region and a memory region, forming a first well and a second well of different conductive types over the substrate in the memory region to allow the first and second wells to contact each other, forming an isolation trench over the substrate in the logic region and simultaneously forming a memory trench over the substrate on a border formed by the contact of the first and second wells in the memory region, forming a liner layer on a surface of the isolation trench and simultaneously forming a memory layer on a surface of the memory trench, and filling the isolation trench with an isolation layer and filling the memory trench with a conductive layer.

BRIEF DESCRIPTION OF THE DRAWINGS

FIGS. 2A to 2C illustrate a non-volatile memory device in accordance with a second embodiment of the present invention.

DETAILED DESCRIPTION

Figure 1A:
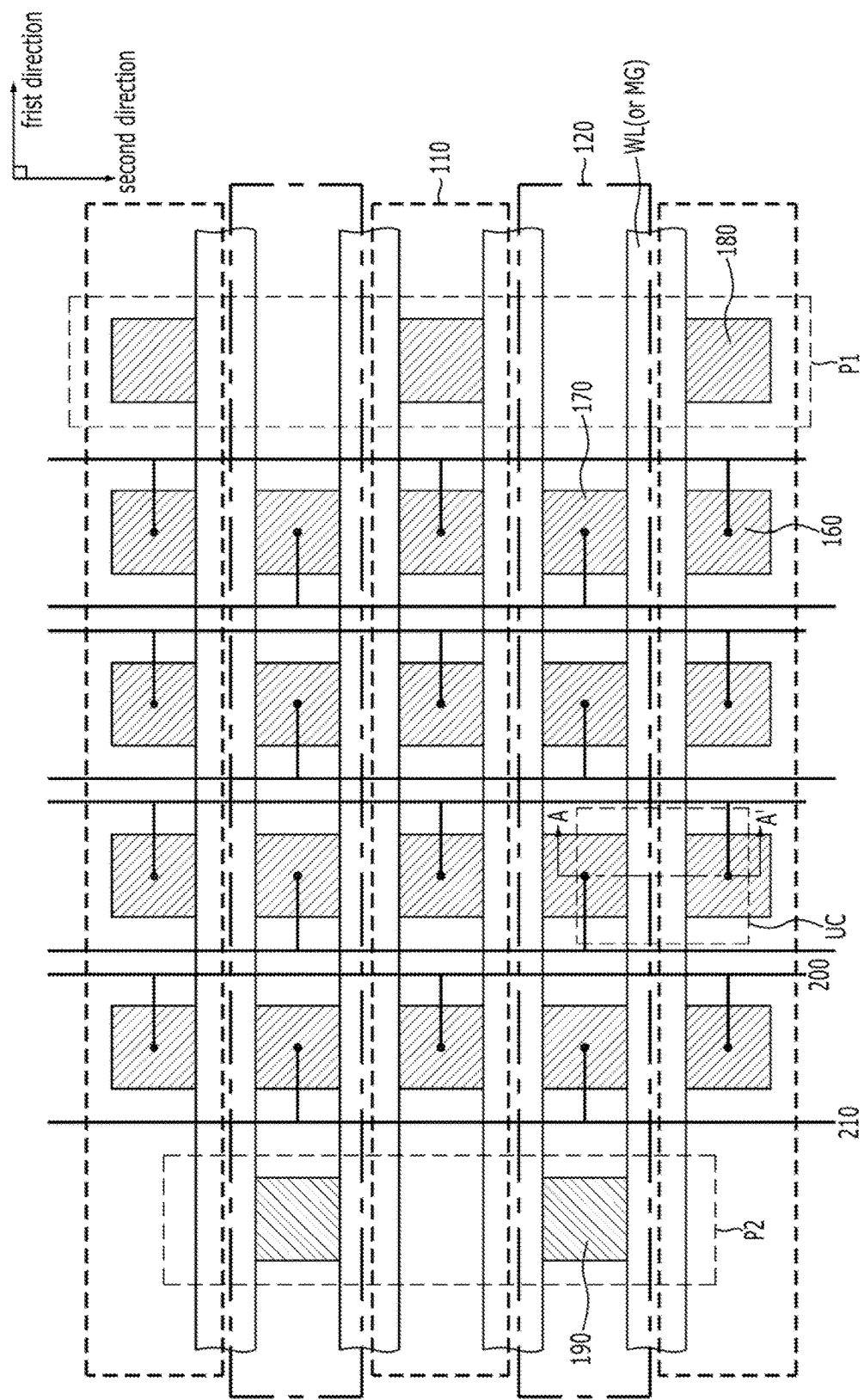
FIGS. 1A and 1B illustrate a non-volatile memory device in accordance with a first embodiment of the present invention.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate. Throughout the disclosure, reference numerals correspond directly to the like parts in the various figures and embodiments of the present invention.

Described hereafter is a non-volatile memory device that may be easily applied to embedded memory utilized in the field of System on Chip (SoC). The result is potential improvement of integration degree and operation characteristics of the embedded memory. Flash memory as embedded memory will be discussed in reference to embodiments of the present disclosure. Flash memory may be classified into a floating gate type flash memory and a Silicon-Oxide-Nitride-Oxide-Silicon (SONOS) type flash memory. The flash memory of the SONOS type uses a mechanism of trapping or de-trapping an electric charge into or out of a material layer trap site, e.g., a nitride layer.

Typical SONOS type flash memory includes a memory layer, a memory gate (or a gate electrode) stacked over the memory layer, and a source region and a drain region that are disposed on both sidewalls of a substrate of the stacked structure of the memory gate (or a gate electrode) and the memory layer. The memory layer includes a tunnel insulation layer, a charge trapping layer and a charge blocking layer that are sequentially stacked therein. Since the embedded memory is fabricated through a logic process, it is desirable to design the non-volatile memory device to be fabricated without additional processes other than existing logic processes in order to prevent deterioration of the characteristics of the embedded memory.

However, the SONOS typed flash memory has disadvantages in that it necessarily requires additional processes other than the logic process to form the memory layer. Particularly, since the memory layer is required to be high quality to be used as data storage, process burden (e.g., thermal burden) applied to preformed structures during the memory layer formation process is heavy. Consequentially, as the memory layer is formed by performing additional processes other than logic process in the SONOS typed flash memory, logic compatibility is degraded and device characteristics are deteriorated. Thus, there is limitation in applying SONOS type flash memory to embedded memory.

To solve this problem, the following embodiments of the present invention provide a non-volatile memory device that may be easily applied to embedded memory, have logic compatibility, and improved integration degree and operation characteristics. Specifically, the following embodiments provide a SONOS type non-volatile memory device that has logic compatibility and a method for fabricating the same. In accordance with embodiments of the present invention, a non-volatile memory device will use a liner layer (which is formed during a trench-type isolation structure fabrication process) as a memory layer, instead of forming a memory layer through additional processes other than the existing logic process. The liner layer may comprise a wall oxide layer, a liner nitride layer, and a liner oxide layer, which are sequentially stacked on the surface of a trench for isolation.

In the following description, a first conductive type and a second conductive type are in a complementary relationship to each other. In other words, when the first conductive type is a P-type, the second conductive type is an N-type, and when the first conductive type is the N-type, the second conductive type is the P-type. For the sake of convenience, it is assumed that the first conductive type is the P-type and the second conductive type is the N-type. In short, a non-volatile memory device of the P-type channel is exemplarily described hereafter.

Figure 1B:
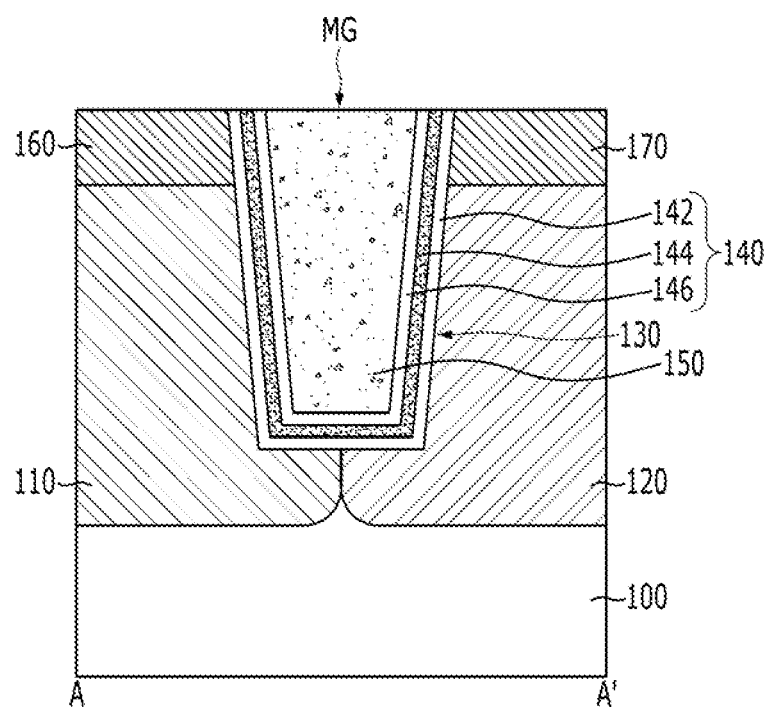

FIGS. 1A to 1B illustrate a non-volatile memory device in accordance with a first embodiment of the present invention. FIG. 1A is a plan view of a part of a cell array including unit cells UC, and FIG. 1B is a cross-sectional view of one of the unit cells taken along a line A-A' shown in FIG. 1A.

Referring to FIGS. 1A to 1B, a non-volatile memory device in accordance with the first embodiment of the present invention may include a first well 110 of the first conductive type formed over a substrate 100, a second well 120 of the second conductive type formed over the substrate 100, a memory gate MG formed over the substrate 100 on the border between the first well 110 and the second well 120, and a first junction region 160 of the first conductive type and a second junction region 170 of the first conductive type respectively formed over the first well 110 and the second well 120, which are on both sidewalls of the memory gate MG.

Also, a non-volatile memory device in accordance with the first embodiment of the present invention may further include a first pick-up region P1 having a first impurity region 180 of the first conductive type functioning as a pick-up of the first well 110, a second pick-up region P2 having a second impurity region 190 of the second conductive type functioning as a pick-up of the second well 120, and a first conductive line 200 and a second conductive line 210 respectively coupled to the first junction region 160 and the second junction region 170.

Next, the constituent elements of a non-volatile memory device in accordance with the first embodiment of the present invention will be described in detail.

The non-volatile memory device may include a first well 110 of the first conductive type and a second well 120 of the second conductive type.

The second well 120 may function as an active well, which provides a channel in each unit cell UC, and the first well 110 may function as an isolating well, which electrically isolates the adjacent second wells 120 from each other. The first well 110 may function as an extended region of the first junction region 160. In other words, the first well 110 may function as the first junction region 160. The first well 110 and second well 120 may be formed by ion-implanting an impurity into the substrate 110. The first well 110 and second well 120 may be of a bar type or a line type extended in a first direction. The first well 110 and the second well 120 may be provided in plural, and disposed alternately in a second direction while contacting each other.

The substrate 100 may be a semiconductor substrate. The semiconductor substrate may be of a monocrystalline state and include a silicon-containing material. For example, the substrate 100 may be a bulk silicon substrate or a silicon on insulator (SOI) substrate where a support substrate, a buried insulation layer, and a monocrystalline silicon layer are sequentially stacked.

In a non-volatile memory device in accordance with the first embodiment of the present invention, the memory gate MG may include a trench 130 formed over the substrate on the border between the first well 110 and second well 120, a memory layer 140 formed on the surface of the trench 130, and a gate electrode 150 to gap-fill the trench 130 over the memory layer 140. The memory gate MG may be a word line WL.

The trenches 130 may be provided in plural in the second direction and formed to be spaced apart with a predetermined gap between them. The trenches 130 may be of a line type extended in the first direction along with the boundary area of the first wells 110 and second wells 120. The boundary area of the first wells 110 and second wells 120 may be adjacent to the bottom of each of the trenches 130, and one sidewall and another sidewall of each of the trenches 130 may be adjacent to the first well 110 and the second well 120, respectively. The area that the trench 130 contacts the first well 110 may be the same as the area that the trench 130 contacts the second well 120 in order to obtain uniform operation characteristics. The trenches 130 may be formed during a process of forming the trench-type isolation structure (not shown).

The memory layer 140 may be a stacked layer comprising a tunnel insulation layer 142, a charge trapping layer 144, and a charge blocking layer 146, which are sequentially stacked. The memory layer 140 may have a predetermined thickness along with the surface, i.e., the bottom and side of the trench 130. The memory layer 140 may be an insulation layer. That is, each of the insulation layer 142, the charge trapping layer 144, and the charge blocking layer 146 may include a single or stacked layer comprising one or more selected from the group consisting of an oxide layer, a nitride layer and an oxide-nitride layer. The tunnel insulation layer 142 may include an oxide layer and may be a wall oxide layer of an isolation structure (not shown). The charge trapping layer 144 may include a nitride layer and may be a liner nitride layer of the isolation structure. The charge blocking layer 146 may include an oxide layer and may be a liner oxide layer of the isolation structure. As described above, the memory layer 140 may include a liner layer of the isolation structure comprising the side all oxide layer, liner nitride layer, and liner oxide layer, which are sequentially stacked. This will be described below in detail with reference to the accompanying drawings FIGS. 3A to 3E.

A non-volatile memory device in accordance with the first embodiment of the present invention may include the first junction region 160 of the first conductive type, the second junction region 170 of the first conductive type, respectively formed over the first well 110 and the second well 120 disposed on both sidewalls of the memory gate MG, the first conductive line 200 coupled to the first junction regions 160, and the second conductive line 210 coupled to the second junction regions 170.

The first junction region 160 and the second junction region 170 may function as a source region and a drain region, and have a relatively higher impurity-doping concentration than the first well 110 and second well 120. The first junction regions 160 and the second junction regions 170 may be formed to be spaced apart with a predetermined gap between them in the first direction. The first junction region 160 and second junction region 170 may be symmetrically disposed about the memory gate MG in the second direction. The first conductive line 200 and second conductive line 210 may function as a source line and a bit line. The first conductive line 200 and second conductive line 210 may be extended in the second direction, and coupled to the first junction regions 160 and second junction regions 170 disposed in the second direction. The first conductive lines 200 and the second conductive lines 210 may be disposed in the first direction with a predetermined gap therebetween.

In accordance with the first embodiment of the present invention as described above, the non-volatile memory device may effectively improve the integration degree since the memory gate MG is positioned on the border of the first well 110 and the second well 120, which have different conductive types from one another, thereby simplifying the structure of the cell array simple. The non-volatile memory device may be implemented by a P-type channel, and therefore may prevent current deterioration, which may occur due to an increase in cycling in comparison with an N-type channel implemented device. Thus, the endurance characteristics of the non-volatile memory device may be improved. Also, since the memory gate MG is buried in the substrate 100, the effective channel length may be increased to further operation characteristics.

Hereinafter, a non-volatile memory device in accordance with a second embodiment of the present invention will be described with reference to the accompanying drawings FIGS. 2A to 2C. For a clearer understanding, detailed descriptions on the elements having the same reference numerals and the same structures and functions as described with reference to FIGS. 1A and 1B, will be omitted.

Figure 2A:
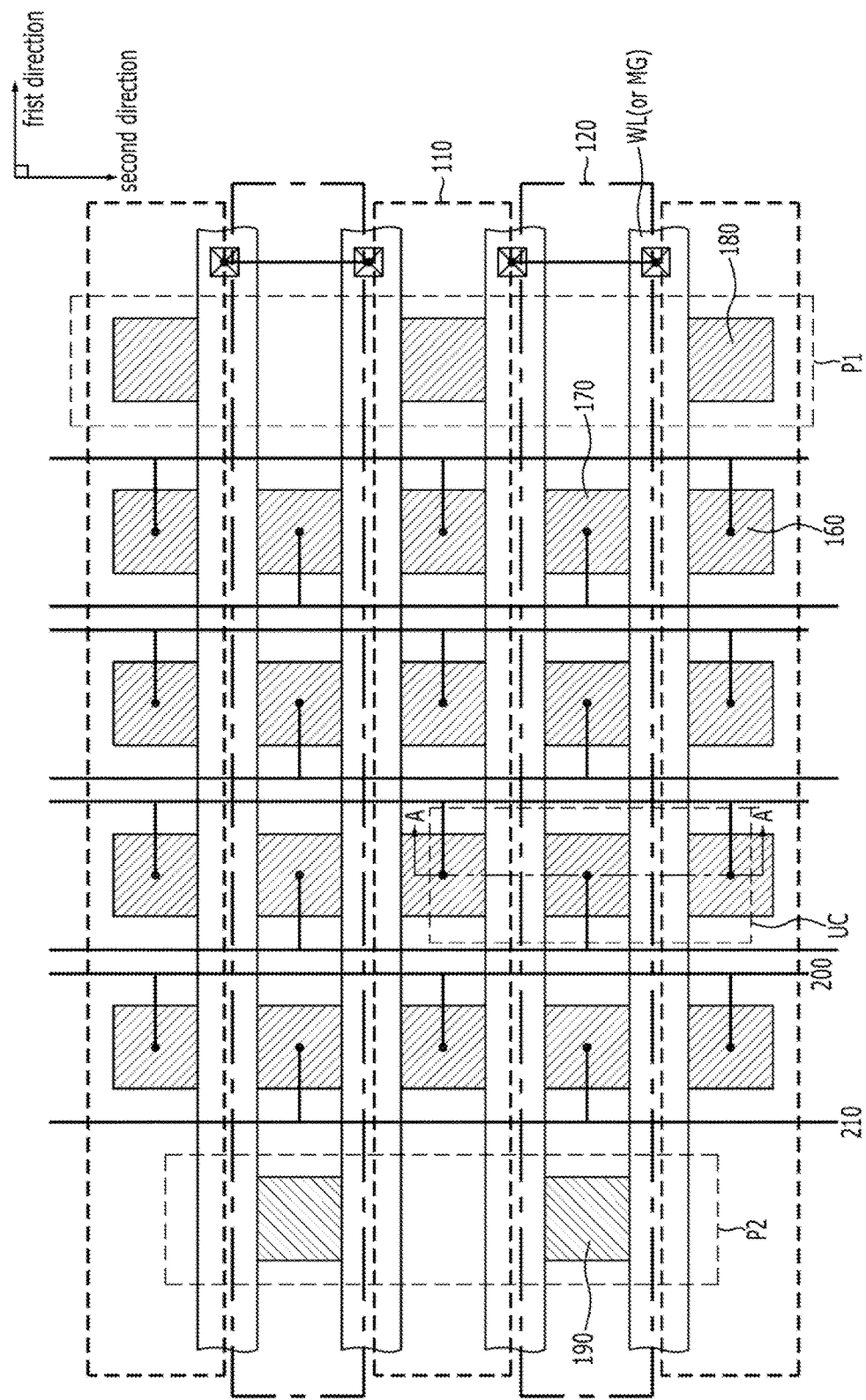
Figure 2C:
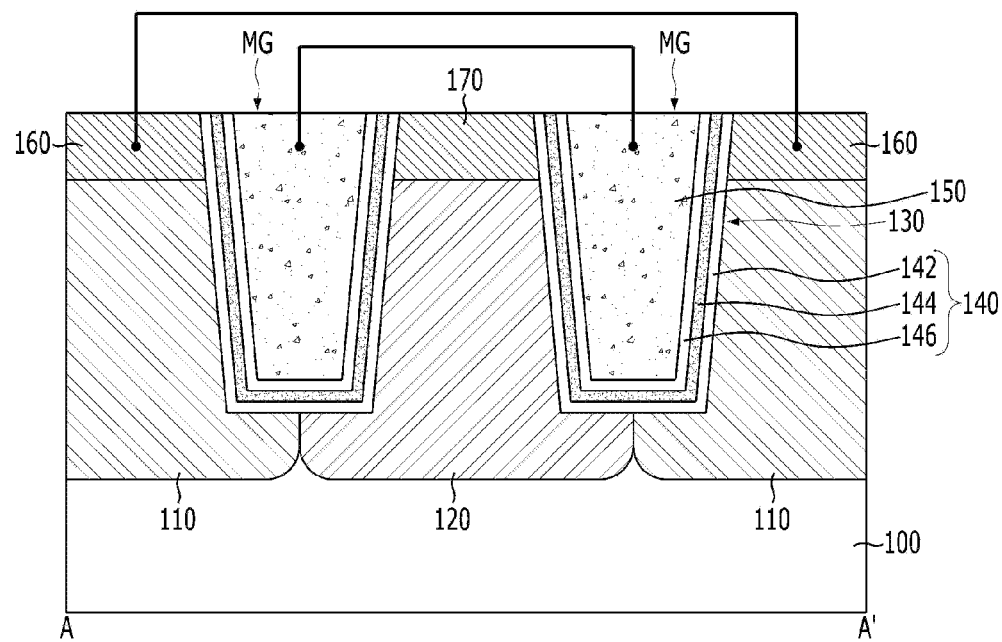

FIGS. 2A to 2C illustrate a non-volatile memory device in accordance with a second embodiment of the present invention FIGS. 2A and 2B are plan views of a part of a cell array including unit cells UC, FIG. 2C is a cross-sectional view of a unit cell taken along a line A-A' shown in FIG. 2A.

Referring to FIGS. 2A to 2C, the non-volatile memory device in accordance with the second embodiment of the present invention may include a first well 110 of the first conductive type formed over a substrate 100, a second well 120 of the second conductive type formed over the substrate 100, a memory gate MG formed over the substrate 100 on the border of the first well 110 and the second well 120, and a first junction region 160 of the first conductive type and a second junction region 170 of the first conductive type respectively formed over the first well 110 and the second well 120, which are on both sidewalls of the memory gate MG.

The non-volatile memory device in accordance with second embodiment of the present invention may further include a first pick-up region P1 having a first impurity region 180 of the first conductive type functioning as a pick-up of the first well 110, a second pick-up region P2 having a second impurity region 190 of the second conductive type functioning as a pick-up of the second well 120, and a first conductive line 200 and a second conductive line 210 respectively coupled to the first junction region 160 and the second junction region 170.

The non-volatile memory device in accordance with the second embodiment of the present invention may have two merged memory gates MGs or word lines, both of which contact one of the first and second wells 110 and 120 which are iteratively and alternately disposed. In other words, two memory gates MGs may share the single second well 120, and may be provided the same bias during an operation. In order to electrically merge the two memory gates MGs, one sides of the two memory gates MGs may be coupled with each other or a line structure for coupling the memory gates MGs may be formed shown in FIG. 2B.

Since two memory gates MGs share the single second well 120, the unit cell UC may include two first junction regions 160 and one junction region 170, and the same bias may be applied to the two first junction regions 160 during an operation. In short, the two first junction regions 160 may be electrically merged in terms of the unit cell UC.

In accordance with the second embodiment of the present invention, the non-volatile memory device may improve operation characteristics and yield since the unit cell has two channels as two memory gates MGs share one second well 120. Specifically, as the number of the channels increases, the space for storing electric charges increases as well, and even though one channel is damaged due to a shortage of process margin, the yield may be secured due to the presence of the other channel.

Since the memory gates MGs are disposed on the border between the first well 110 and second well 120 and the structure of the cell array is simple, the integration degree may be effectively improved. Furthermore, the non-volatile memory device may be easily implemented by a P-type channel and to prevent current deterioration, which may be caused by an increase in cycling compared with the N-type channel implemented device. Thus, the endurance characteristics of the non-volatile memory device may be improved.

Since the memory gate MG is buried in the substrate 100, the effective channel length may be increased and operation characteristics may be improved.

Deterioration of characteristics occurring during a memory layer 140 fabrication process may be prevented, and the logic compatibility may be improved, since a liner layer of the isolation structure (not shown) formed through an existing logic process (without additional processes) is adopted in the non-volatile memory device as the memory layer 140.

Hereafter, an operation of the unit cell UC of the r on-volatile memory device in accordance with the first and second embodiments of the present invention will be described with reference to the following Table 1, Table 1 shows an example of an operation condition of the unit cell UC of the non-volatile memory device in accordance with the first and second embodiments of the present invention. Herein, even though the structures of the unit cells of the non-volatile memory device in accordance with the first and second embodiments is different from each other, the operation method as described below may be applied in the same manner.

TABLE 1

| Operation | Program | Erase | Read |
|---|---|---|---|
| Scheme | HCI | BTBT | Reverse |
| Memory Gate MG | VDD | −VPP1 | VDD |
| First Junction Region 160 | GND | GND | GND |
| Second Junction Region 170 | −VPP1 | GND | −VPP2 |
| Second well (Active well) 120 | GND | VDD | GND |

A program operation may be performed using a Hot Carrier Injection (HCI) scheme. A ground voltage GND may be applied to the first well 110 and the second well 120, and a power source voltage VDD and a first negative pumping voltage −VPP1 may be applied to the memory gate MG and the second junction region 170, respectively. A bias voltage may applied to the first well 110 through the first junction region 160 or the first pick-up region P1 and to the second well 120 through the second pick-up region P2. A level of a first pumping voltage VPP1 may be higher than the level of the power source voltage VDD.

Subsequently, an erase operation may be performed using a Band-To-Band Tunneling (BTBT) scheme. When the ground voltage GND is applied to the first junction region 160 and the second junction region 170, the first negative pumping voltage −VPP1 and the power source voltage VDD may be applied to the memory gate MG and the second well 120, respectively.

A read operation may be performed using a reverse read operation scheme. During the reverse read operation, data may be read through charges moving in the opposite direction of charges during a program operation. During the read operation, the ground voltage GND may be applied to the first well 110 and the second well 120, and the power source voltage VDD and a second negative pumping voltage −VPP 2 may be applied to the memory gate MG and the second junction region 170, respectively. The second pumping voltage VPP2 level may be higher than the level of the power source voltage VDD and lower than the level of the first pumping voltage VPP1. It is also possible to sense whether or not charges are trapped through the current difference between the read operation and the program operation.

Described hereafter in detail is a fabrication process of a non-volatile memory device in accordance with the first and second embodiments of the present invention having the liner layer of the isolation structure formed through an existing logic process as the memory layer. As an example, a method for fabricating the non-volatile memory device in accordance with the first embodiment of the present invention is described.

FIGS. 3A to 3E are cross-sectional views illustrating a method for fabricating the non-volatile memory device including a substrate 11 having a logic region.

FIGS. 4A to 4E are cross-sectional views illustrating a method for fabricating the non-volatile memory device including a substrate 11 having a memory region.

The substrate 11 may include a logic region and a memory region. The logic region may include a power device region and a CMOS region. In these embodiments of the present invention, it is assumed that the logic region is an NMOS region. The memory region may include the non-volatile memory device in accordance with the above-described embodiments of the present invention. The substrate 11 may be a semiconductor substrate. The semiconductor substrate may be of a monocrystalline state, and include a silicon-containing material. For example, the substrate 11 may be a bulk silicon substrate or a Silicon On Insulator (SOI) substrate.

Figure 3A:
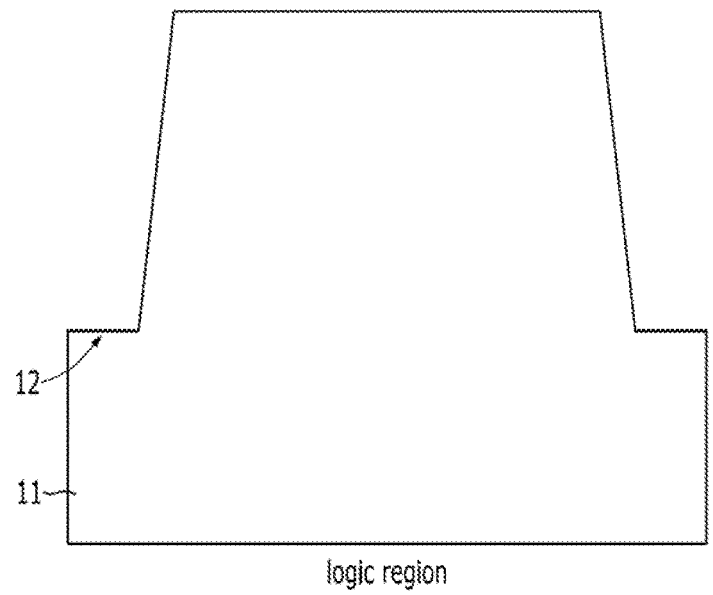
FIGS. 3A to 3E are cross-sectional views illustrating a method for fabricating a non-volatile memory device in accordance with an embodiment of the present invention.
Figure 4A:
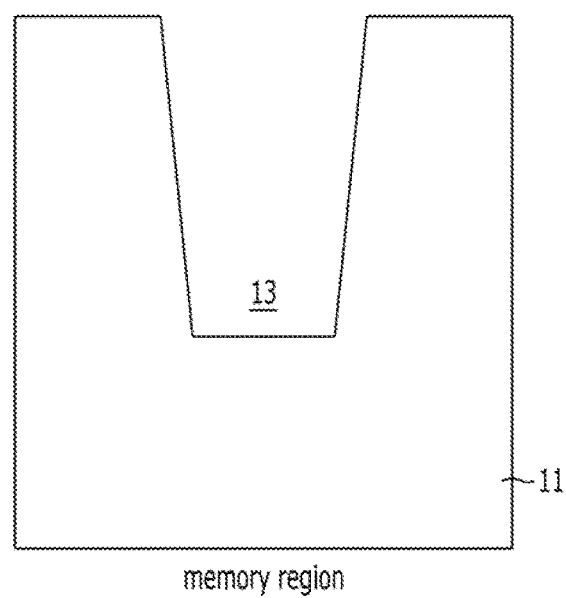
FIGS. 4A to 4E are cross-sectional views illustrating a method for fabricating a non-volatile memory device in accordance with an embodiment of the present invention.

Referring to FIGS. 3A and 4A, a mask pattern (not shown) for isolation is formed over the substrate 11, and an isolation trench 12 is formed in the logic region by etching the substrate 11 with the mask pattern used as an etch barrier and simultaneously a memory trench 13 is formed in the memory region. The etch process for forming the isolation trench 12 and the memory trench 13 may be a dry etch process. The sidewalls of the isolation trench 12 and the memory trench 13 may be slanted, and the isolation trench 12 and the memory trench 13 may have the same or different aspect ratios.

Figure 3B:
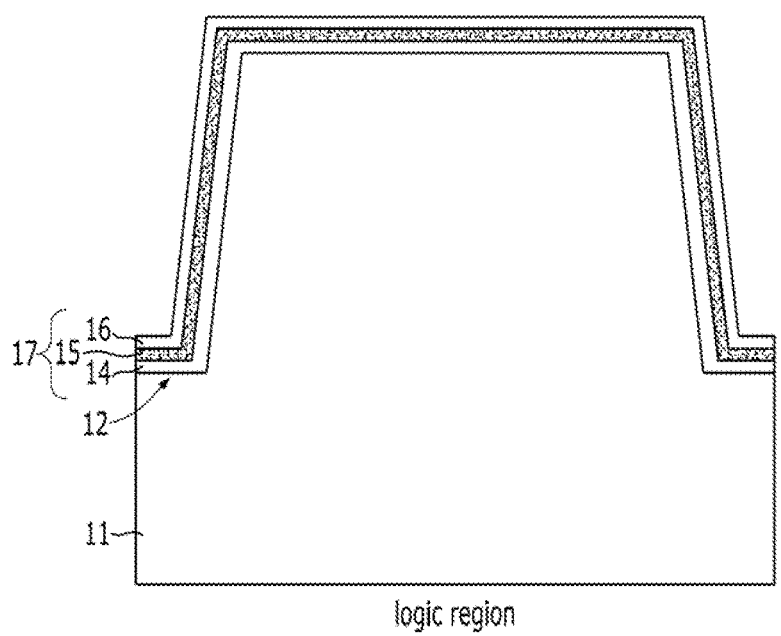
Figure 4B:
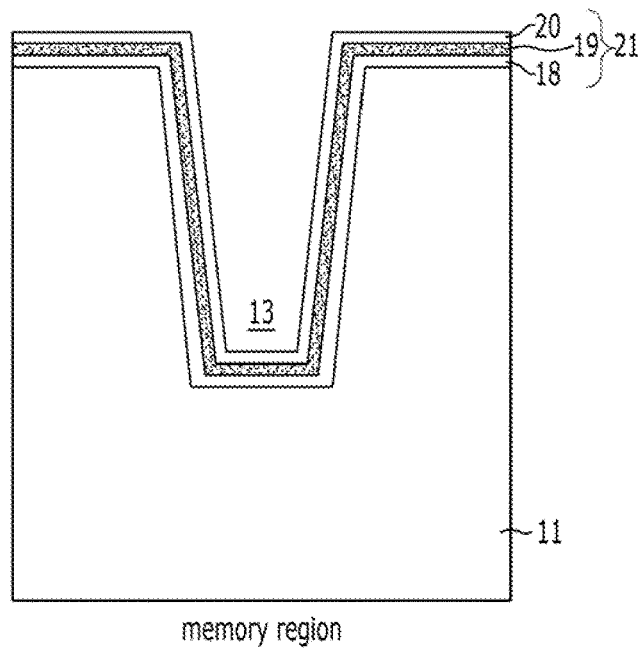

Referring to FIGS. 3B and 4B first liner layers 14 and 18 are formed over the surface of the substrate 11 having the isolation trench 12 and the memory trench 13. The first liner layers 14 and 18 may be formed of an oxide layer, which may be formed through a thermal oxidation process. The first liner layers 14 and 18 may cure defects and damage caused on the surface of the isolation trench 12 and the memory trench 13 during their formation process. Furthermore, the first liner layers 14 and 18 may function as a sidewall oxidation layer 14 in the logic region, and as a tunnel insulation layer 18 in the memory region.

Second liner layers 15 and 19 are formed over the surface of a structure having the first liner layers 14 and 18. The second liner layers 15 and 19 may be formed of a nitride layer to have a uniform thickness over the surface of a structure having the isolation trench 12 and the memory trench 13. The second liner layers 15 and 19 may prevent impurities from penetrating and/or diffusing. Moreover, the second liner layers 15 and 19 may function as a liner nitride layer 15 in the logic region, and as a charge trapping layer 19 in the memory region.

Third liner Payers 16 and 20 are formed over the surface of a structure having the second liner layers 15 and 19. The third liner layers 16 and 20 may be formed of an oxide layer. The third liner layers 16 and 20 may improve interfacial characteristics of the second liner layers 15 and 19. Furthermore, the third liner layers 16 and 20 may function as a liner oxidation layer 16 in the logic region, and as a charge blocking layer 20 in the memory region.

Through the above-described processes, the liner layer 17 (where the sidewall oxidation layer 14, the liner nitride layer 15, and the liner oxidation layer 16 are sequentially stacked over the surface of the substrate 11) having the isolation trench 12 of the logic region may be formed and simultaneously the memory layer 21 (where the tunnel insulation layer 18, the charge trapping layer 19, and the charge blocking layer 19 are sequentially stacked over the surface of the substrate 11 having the memory trench 13 of the memory region) may be formed.

The third liner layers 16 and 20, particularly the charge blocking layer 20, may be formed through the subsequent process after formation of the second liner layers 15 and 19.

Figure 3C:
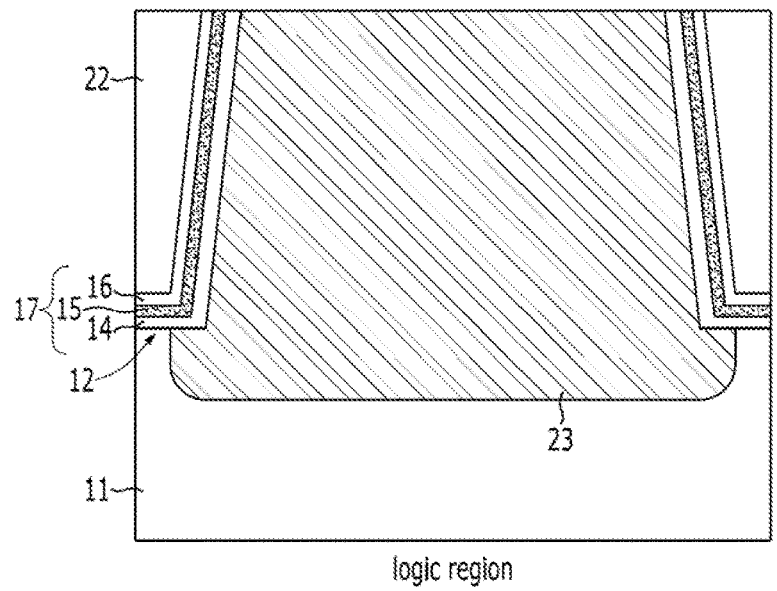
Figure 4C:
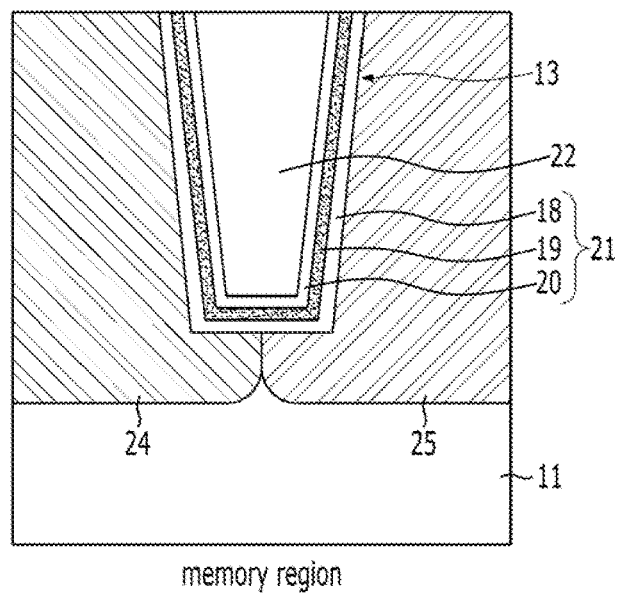

Referring to FIGS. 3C and 4C, a gap-fill insulation layer 22 covering the whole surface of the substrate 11 is formed simultaneously while gap-filling the isolation trench 12 and the memory trench 13. The gap-fill insulation layer 22 may be formed of an oxidation layer, e.g., a High Density Plasma (HDP) oxidation layer.

Until the surface of the substrate 11 is exposed, a planarization process is performed on the gap-fill insulation layer 22, the liner layer 17, and the memory layer 21. The planarization process may be a Chemical Mechanical Polishing (CMP) process.

As described above, the isolation structure including the liner layer 17 (which comprises the isolation trench 12, the sidewall oxidation layer 14, the liner nitride layer 15 and the liner oxidation layer 16 stacked) and the gap-fill insulation layer 22 may be formed in the logic region.

A logic well 23 is formed by ion-implanting an impurity into the substrate 11 of the logic region, and a first well 24 of the first conductive type and a second well 25 of the second conductive type are formed over the substrate 11 of the memory region. The logic well 23 and the first well 24 may be formed at the same time since they have the same conductive type.

Figure 3D:
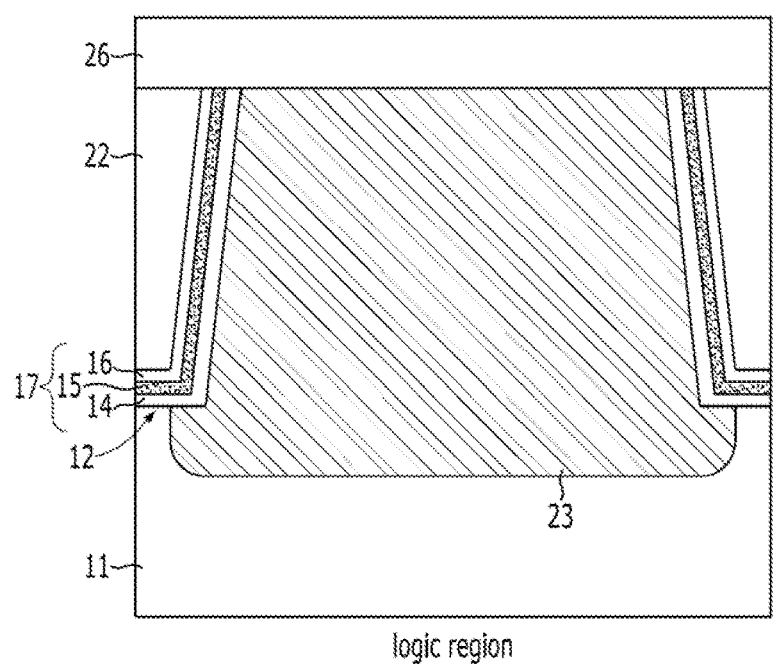
Figure 4D:
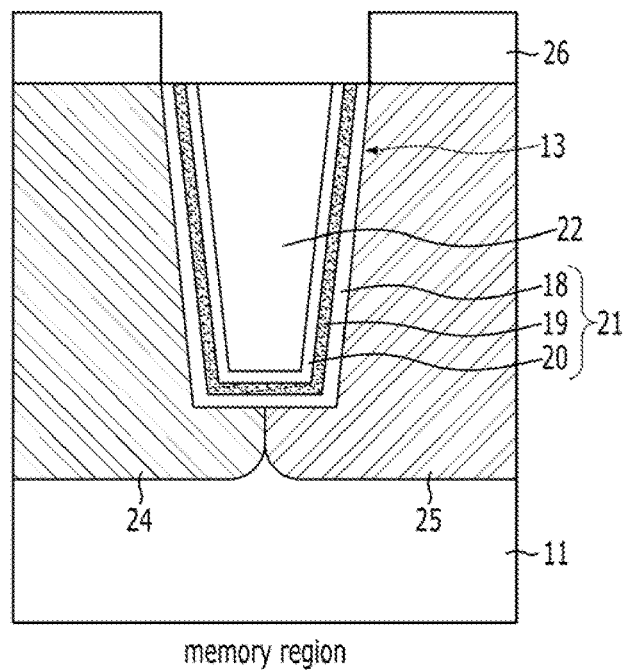

Referring to FIGS. 3D and 4D, a mask pattern 26 which covers the logic region and opens at least the gap-fill insulation layer 22 of the memory region is formed over the substrate 11. The mask pattern 26 may expose the substrate 11 adjacent to the memory layer 21 and the memory trench 13.

The gap-fill insulation layer 22 inside the memory trench 13 is removed using the mask pattern 26 as an etch barrier. The etch process for removing the gap-fill insulation layer 22 may be a wet etch process in order to minimize damage to the preformed structure.

Although not shown in the drawings, the charge blocking layer 20 of the memory layer 21 may be removed during the process of removing the gap-fill insulation layer 22. Therefore, the charge blocking layer 20 may be additionally formed after the gap-fill insulation layer 22 and the mask pattern 26 are removed. A gate insulation layer may be formed in the logic region while simultaneously forming the charge blocking layer 20 in the memory region.

Figure 3E:
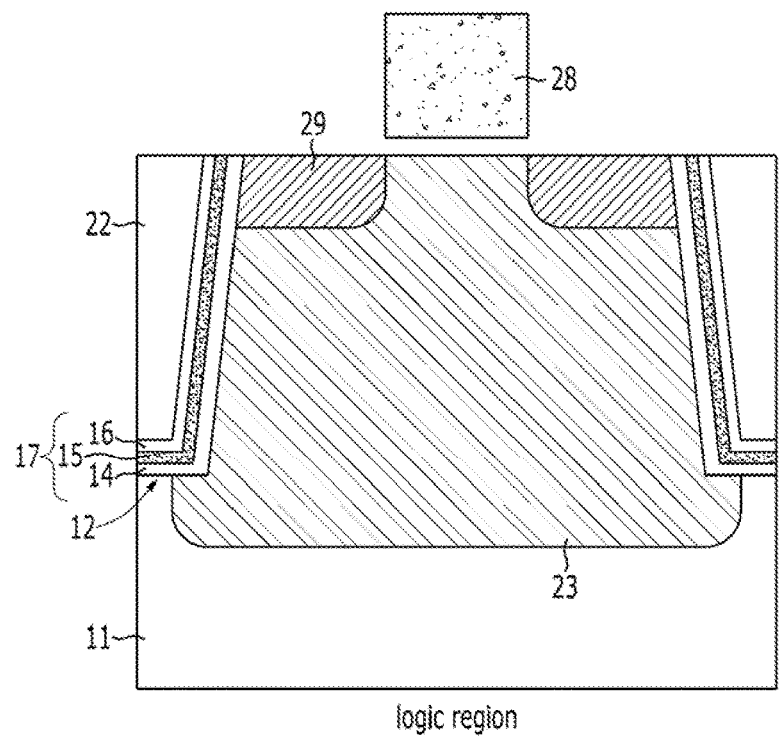
Figure 4E:
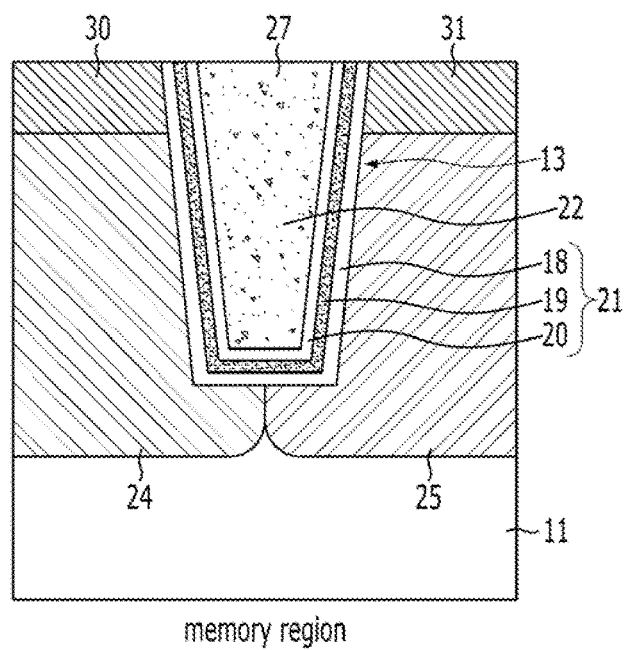

Referring to FIGS. 3E and 4E, after a gate conductive layer is formed to gap-fill the memory trench 13 and to cover the whole surface of the substrate 11, a logic gate 28 is formed in the logic region by selectively etching the gate conductive layer and simultaneously a gate electrode 27 gap-filled in the memory trench 13 is formed in the memory region. The gate conductive layer may be a poly-silicon layer.

As described above, the memory gate including the memory trench 13, the memory layer 21 and the gate electrode 27 may be formed in the memory region.

A first junction region 30 of the first conductive type and a second junction region 31 of the first conductive type are formed over the first well 24 and the second well 25, respectively, to be disposed on a source region 29 and a drain region 29 over the substrate 11 of the both sides of a logic gate 28 and on the both sides of the memory gate of the memory region.

Even though not shown in the drawings, the fabrication of the non-volatile memory device may be completed using a well-known semiconductor device fabrication technology.

In accordance with the various embodiments of the present invention, the non-volatile memory device of the SONOS type uses the liner layer 17 of an isolation structure as the memory layer 21, and thus deterioration of characteristics occurring during the memory layer 21 formation process may be prevented, and simultaneously the logic compatibility may be improved.

Also, the integration degree of the non-volatile memory device may be improved since the memory gate is positioned on the border between the contacting first and second well of different conductive types, which simplifies the structure of the cell array. Furthermore, the non-volatile memory device may be easily implemented by the P-type channel and prevent a current deterioration, which may be caused due to the increase in the number of cycles. Thus, the endurance characteristics of the non-volatile memory device may be improved.

Still further, since the memory gate is buried in the substrate, the effective channel length may be increased to improve operation characteristics.

Still further, deterioration of characteristics occurring during the memory layer formation process may be prevented, and the logic compatibility may be improved, since the liner layer of the isolation structure is formed through an existing logic process without the need for an additional process.

As two memory gates share one second well, a unit cell may have two channels. As a result, the operation characteristics and yield may be improved.

Figure 5:
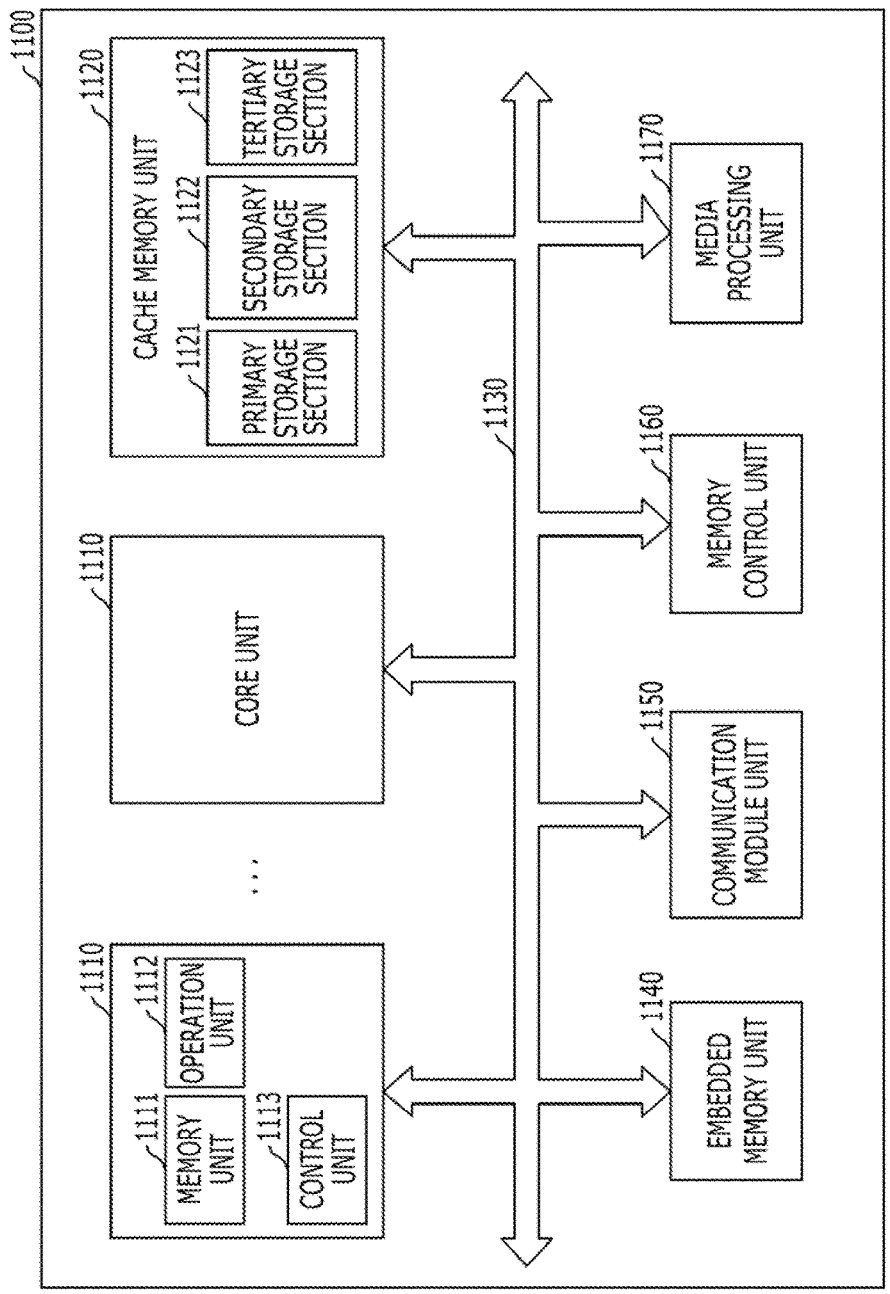
FIG. 5 is schematic diagram illustrating an exemplary electronic apparatus implemented by a non-volatile memory device in accordance with an embodiment of the present invention.

FIG. 5 is schematic diagram illustrating an exemplary electronic apparatus implemented by a non-volatile memory device in accordance with an embodiment of the present invention.

The above and other memory circuits or semiconductor devices based on the disclosed technology can be used in a range of the non-volatile memory devices. FIG. 5 provides some examples of the non-volatile memory device that can implement the memory circuits disclosed herein.

Referring to FIG. 5, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is the part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations, and addresses where data for performing of the operations are stored. The operation unit 1112 is a part which performs operations in the processor 1100. The operation unit 1112 may perform arithmetical operations and logical operations according to results that the control unit 1113 decodes, commands, or the like. The operation unit 1112 may include at least one arithmetic logic unit (ALU) and so on. The control unit 1113 may receive signals from the memory unit 1111 the operation unit 1112, and an external device of the processor 1100, perform extraction, decoding of commands, controlling input and output of signals of processor 1100, and execute processing represented by programs. The cache memory unit 1120 temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be greatest. At least one storage section of the primary storage section 1121, the secondary storage section 1122, and the tertiary storage section 1123 of the cache memory unit 1120 may include one or more of the above-described semiconductor devices in accordance with the embodiments. For example, the cache memory unit 1120 may include a first well of the first conductive type formed over a substrate; a second well of the second conductive type formed over the substrate to contact the first well; a trench formed over the substrate of a border where the first well and the second well contact each other; and a memory gate having a memory layer formed on a surface of the trench and a gate electrode formed to gap-fill the trench over the memory layer.

In accordance with the exemplary embodiments of the present invention, the non-volatile memory device may effectively improve the integration degree since the memory gate MG is positioned on the border of the first well 110 and the second well 120, which have different conductive types, thereby simplifying the structure of the cell array. Furthermore, the non-volatile memory device may be easily implemented by a P-type channel, and therefore it may prevent current deterioration, which may occur due to an increase in the number of cycles in comparison with an N-type channel implemented device. Thus, endurance characteristics of the non-volatile memory device may be improved. Also, since the memory gate MG is buried in the substrate 100, the effective channel length may be increased to improve the operation characteristics.

Although it was shown in FIG. 5 that all the primary, secondary, and tertiary storage sections 1121, 1122 and 1123 are configured inside the cache memory unit 1120, it is to be noted that all the primary, secondary, and tertiary storage sections 1121, 1122 and 1123 of the cache memory unit 1120 may be configured outside the core unit 1110 and may compensate for a difference in data processing speed between the core unit 1110 and an external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is the part which connects the core unit 1110, the cache memory unit 1120, and external devices and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core units 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only volatile memory but also a nonvolatile memory. The volatile memory may include DRAM (dynamic random access memory), mobile DRAM, SRAM (static random access memory), and memory with similar functions to above mentioned memories. The nonvolatile memory may include ROM (read only memory), NOR flash memory, NAND flash memory, phase change random access memory (PRAM), resistive random access memory (RRAM), spin transfer torque random access memory (STTRAM), magnetic random access memory (MRAM), and memory with similar functions.

The communication module unit 1150 may include a module capable of being connected with a wired network, a module capable of being connected with a wireless network, or both. The wired network module may include a local area network (LAN), a universal serial bus (USB), an Ethernet, a power line communication (PLC) such as various devices which send and receive data through transmission lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice, and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

While the present invention has been described with respect to specific embodiments, it should be noted that the embodiments are for describing, not limiting, the present invention. Further, it should be noted that the present invention may be achieved in various ways through substitution, change, and modification by those skilled in the art without departing from the scope of the present invention as defined by the following claims.

What is claimed is:

1. A non-volatile memory device comprising:
    a first well of a first conductive type formed over a substrate;
    a second well of a second conductive type formed over the substrate to contact the first well;
    a trench formed over the substrate on a border formed by the contact of the first well and the second well; and
    a memory gate having a memory layer formed over a surface of the trench and a gate electrode formed to fill the trench over the memory layer,
    wherein the memory gate, the first well and the second well extend longer in a first direction than a second direction which is orthogonal to the first direction.

2. The non-volatile memory device of claim 1, further comprising:
    a first junction region of a first conductive type formed in the first well, and
    a second junction region of the first conductive type formed over the second well.

3. The non-volatile memory device of claim 1, wherein the first well and the second well are disposed so that the border is disposed at a bottom of the trench.

4. The non-volatile memory device of claim 1, wherein the memory layer includes a liner layer of an isolation structure.

5. The non-volatile memory device of claim 2, wherein the first conductive type includes a P-type and the second conductive type includes an N-type.

6. A non-volatile memory device, comprising:
    a plurality of first wells of a first conductive type formed over a substrate;

a plurality of second wells of a second conductive type formed over the substrate between the first wells to contact the first wells;
a plurality of trenches each formed over the substrate on each of a plurality of borders formed by the contacts of the second wells and the first wells; and
a plurality of memory gates each having a memory layer formed over a surface of each of the trenches and a gate electrode filling each of the trenches over the memory layer,
wherein a pair of the memory gates contacting the second well are provided the same bias during an operation thereby sharing the second well,
wherein each of the memory gates, the first wells and the second wells extend longer in a first direction than a second direction which is orthogonal to the first direction.

7. The non-volatile memory device of claim 6, further comprising:
a plurality of first junction regions of the first conductive type each formed over each of the first wells; and
a second junction region of the first conductive type formed over the second well.

8. The non-volatile memory device of claim 7, wherein the first junction regions are provided with the same bias during an operation.

9. The non-volatile memory device of claim 6, wherein the first well and the second well are disposed so that the border is at a bottom of the trench.

10. The non-volatile memory device of claim 6, wherein the memory layer includes a liner layer of an isolation structure.

11. The non-volatile memory device of claim 7, wherein the first conductive type includes a P-type and the second conductive type includes an N-type.

12. A non-volatile memory device, comprising: a plurality of first wells of a first conductive type formed over a substrate, extended in a first direction, and spaced apart from each other in a second direction crossing the first direction; a plurality of second wells of a second conductive type formed over the substrate, extended in the first direction, and spaced apart from each other in the second direction, wherein adjacent first and second wells contact each other; a plurality of trenches each formed over the substrate on each of a plurality of borders formed by the contacts of the adjacent first and second wells; a plurality of memory gates each having a memory layer formed over a surface of each of the trenches and a gate electrode filling each of the trenches over the memory layer; a plurality of first junction regions of the first conductive type each formed over each of the first wells between the memory gates and spaced apart from each other in the first direction; and a plurality of second junction regions of the first conductive type each formed over each of the second wells between the memory gates and spaced apart from each other in the first direction.

13. The non-volatile memory device of claim 12, further comprising:
a first pick-up region having a first impurity region of the first conductive type formed over one of the first wells; and
a second pick-up region having a second impurity region of the second conductive type formed over one of the second wells.

14. The non-volatile memory device of claim 12, wherein each pair of the memory gates contacting each of the second wells are provided the same bias during an operation thereby sharing the contacting one of the second wells.

15. The non-volatile memory device of claim 12, wherein the first wells and the second wells are alternately disposed in a second direction.

16. The non-volatile memory device of claim 12, wherein the trenches are extended in the first direction and spaced apart in a second direction.

17. The non-volatile memory device of claim 12, wherein each of the borders is disposed at each bottom of the trenches.

18. The non-volatile memory device of claim 12, wherein the first junction region and the second junction region are symmetrically disposed about the memory gate in the second direction.

19. The non-volatile memory device of claim 12, wherein the memory layer includes a liner layer of an isolation structure.

20. The non-volatile memory device of claim 12, wherein the first conductive type includes a P-type and the second conductive type includes an N-type.

* * * * *